(12) United States Patent
Sim et al.

(10) Patent No.: US 7,785,754 B2
(45) Date of Patent: Aug. 31, 2010

(54) DEFECT REPAIR METHOD FOR PHOTOMASK AND DEFECT-FREE PHOTOMASK

(75) Inventors: Hong-seok Sim, Suwon-si (KR); Moon-gyu Sung, Seoul (KR); Sang-hyeon Lee, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 324 days.

(21) Appl. No.: 11/836,256

(22) Filed: Aug. 9, 2007

(65) Prior Publication Data

US 2008/0081267 A1  Apr. 3, 2008

(30) Foreign Application Priority Data

Sep. 1, 2006 (KR) .................. 10-2006-0084251

(51) Int. Cl.
*G03F 1/00* (2006.01)
(52) U.S. Cl. ............................ 430/5; 216/52
(58) Field of Classification Search ............ 430/5, 430/311; 250/309, 492.2; 216/52
See application file for complete search history.

(56) References Cited

U.S. PATENT DOCUMENTS

| | | | |
|---|---|---|---|
| 5,569,392 A * | 10/1996 | Miyoshi et al. | 430/5 |
| 5,807,650 A | 9/1998 | Komano et al. | |
| 5,882,823 A * | 3/1999 | Neary | 430/5 |
| 6,030,731 A * | 2/2000 | Yang | 430/5 |
| 6,103,430 A * | 8/2000 | Yang | 430/5 |
| 6,335,129 B1 | 1/2002 | Asano et al. | |
| 6,505,625 B1 * | 1/2003 | Uenishi | 128/848 |
| 2003/0215721 A1 * | 11/2003 | Yang et al. | 430/5 |
| 2004/0124175 A1 * | 7/2004 | Ludwig et al. | 216/57 |
| 2006/0022134 A1 * | 2/2006 | Takaoka et al. | 250/309 |

FOREIGN PATENT DOCUMENTS

| | | |
|---|---|---|
| JP | 09-160221 | 6/1997 |
| JP | 11-202474 | 7/1999 |
| KR | 19970071121 | 11/1997 |
| KR | 100141147 | 3/1998 |
| KR | 100166854 | 9/1998 |
| KR | 1998-065745 | 10/1998 |
| KR | 1020000003722 | 1/2000 |
| KR | 1020020058445 | 7/2002 |

OTHER PUBLICATIONS

English Abstract for Publication No. 09-160221.

(Continued)

*Primary Examiner*—Mark F Huff
*Assistant Examiner*—Stewart A Fraser
(74) *Attorney, Agent, or Firm*—F. Chau & Associates, LLC

(57) ABSTRACT

A method of repairing a photomask with a depression defect includes providing a photomask including a depression defect on a transparent substrate, forming a protection layer which covers the depression defect, etching a predetermined depth of the transparent substrate of the photomask with the protection layer as the etch mask, and removing the protection layer and the transparent substrate under the unetched protection layer, wherein a defect free photomask is produced.

11 Claims, 7 Drawing Sheets

OTHER PUBLICATIONS

English Abstract for Publication No. 100141147.
English Abstract for Publication No. 11-202474.
English Abstract for Publication No. 1020020058445.
English Abstract for Publication No. 1997-0071121.
English Abstract for Publication No. 1998-065745.
English Abstract for Publication No. 100166854.
English Abstract for Publication No. 1020000003722.

* cited by examiner

US 7,785,754 B2

DEFECT REPAIR METHOD FOR PHOTOMASK AND DEFECT-FREE PHOTOMASK

CROSS REFERENCE TO RELATED FOREIGN APPLICATION

This application claims priority from Korean Patent Application No. 10-2006-0084251 filed on Sep. 1, 2006. in the Korean Intellectual Property Office, the contents of which are herein incorporated by reference in their entirety.

BACKGROUND OF THE INVENTION

1. Field of the Invention

The present disclosure is directed to a photomask-defect-repair method and a defect-free photomask. More particularly, the present disclosure is directed to methods of physically repairing defects in a photomask using a high-intensity tip of a repairer and the resulting defect-free photomask.

2. Description of the Related Art

Photolithography processes are used to implement basic patterns that are used to form various patterns that are the components of a semiconductor device. Thus, photolithography processes are the first processes used to form patterns of a semiconductor device, and can be considered among the most important processes. In photolithography, it is important to obtain a photomask that contains accurate pattern information. Inaccurate pattern information can be introduced by photomask manufacturing, as well as from defects that occur in normal conditions. In particular, a defect that occurs on the surface of the transparent substrate of a photomask can directly affect forming patterns on a semiconductor wafer. Since a transparent substrate of the photomask directly transfers light, the defect can appear on the surface of a wafer. Due to the challenges of obtaining a defect-free photomask, the majority of photomasks are used after performing a defect-repair process.

A transparent substrate can have two types of detects. An opaque defect that occurs on the surface of transparent substrate is called a dark defect, and a defect that produces a non-uniform surface of the transparent substrate is called a clear defect. The dark defect occurs when an unnecessary optical pattern remains on the surface of the transparent substrate due to inaccurate patterning or incomplete removal. The dark defect can also occur when an alien substance stays on the surface of the transparent substrate. The clear defect can result from defects of the transparent substrate. Types of clear defects include a depression defect and a protrusion defect. The depression defect is a defect that has a hollow surface. The protrusion defect is a defect that rises high or is protruded.

Photomask defects can be repaired using an ion beam or a laser. When using an ion beam, the defect portion is removed using a gallium ion beam or is covered with a carbon layer. When using a laser, the laser is focused on the defect portion for a period of time so that the defect portion is vaporized and therefore repaired. Also, the defect portion can be repaired by etching the transparent substrate to recess the defect portion.

The photomask defect repair process needs accurate control. Photomask repair processes, including methods using an ion beam, a laser, and substrate etching, leave repair marks on the transparent substrate. Since the contour of the dark defect is thinner, the repair mark remains after the dark defect is removed by the ion beam or the laser. A "river-bed" phenomenon is one such, repair mark. Repair processes using an ion beam or laser are well known in the art, and therefore detailed descriptions are omitted.

Previously, correction marks on the transparent substrate introduced by the ion beam or the laser correct process were negligible. However, due to the increased integration density of semiconductor devices, these subtle defects are no longer negligible.

Photomasks with defects are not used in the semiconductor manufacturing process, but are discarded. Since photomasks are expensive, discarding photomasks is costly. In addition, this can hinder the semiconductor manufacturing process since photomasks are not provided in a timely manner.

SUMMARY OF THE INVENTION

An embodiment of the present invention provides a defect-free photomask.

An embodiment of the present invention also provides a method of repairing defects of a photomask.

The above stated objects as well as other objects and features will become clear to those skilled in the art upon review of the following description.

According to an aspect of the present invention, there is provided method for repairing a photomask with a depression defect including forming a protection layer which covers the depression defect, etching a predetermined depth of a transparent substrate of the photomask with the protection layer as the etch mask, and removing the protection layer and the transparent substrate under the unetched protection layer.

According to another aspect of the present invention, there is provided a photomask-defect-repair method including etching a predetermined depth of a transparent substrate of a photomask including a protrusion defect, and physically removing the protrusion defect with a high-intensity tip of a defect repairer.

According to another aspect of the present invention, there is provided a method of repairing a dark defect on a photomask including removing the dark defect, forming a protection layer in an area where the dark defect is removed, etching a predetermined depth of the transparent substrate of the photomask with the protection layer as the etch mask, and removing the protection layer and the transparent substrate under the unetched protection layer.

DETAILED DESCRIPTION OF EXEMPLARY EMBODIMENTS

Figure 1A:
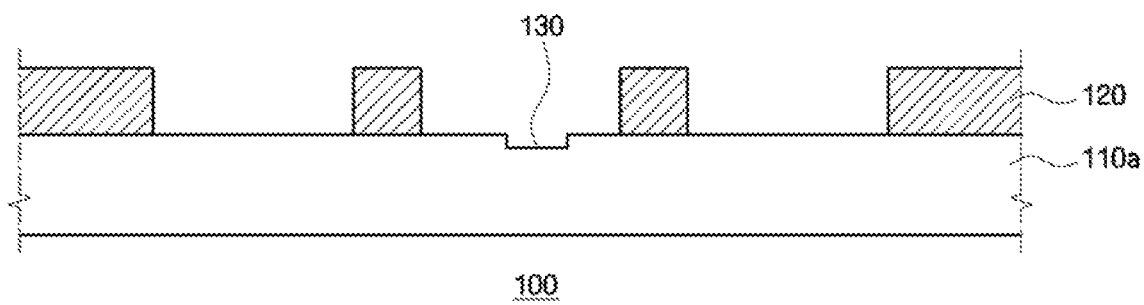
FIG. 1A through 1E are sectional views sequentially illustrating a photomask defect correction method according to an exemplary embodiment of the present invention.

Features of embodiments of the present invention and methods of accomplishing the same may be understood more readily by reference to the following detailed description of exemplary embodiments and the accompanying drawings.

Embodiments of the present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In the drawings, the shape and thickness of layers and regions are exaggerated or reduced for clarity. Like reference numerals refer to like elements throughout the specification.

Hereinafter, a photomask defect correct method according to an exemplary embodiment of the present invention will be described with reference to FIGS. 1A through 1E.

FIG. 1A through 1E are sectional views sequentially illustrating a photomask defect correction method according to an embodiment of the present invention.

Referring to FIG. 1A, a depression defect 130 occurs on a transparent substrate 110a of a photomask 100 formed on an optical pattern 120.

In this exemplary embodiment, the photomask 100 can be used in a photolithography process for manufacturing a semiconductor device or an LCD panel. A binary type photomask can be used in this exemplary embodiment, but it can also be a PSM (phase shift mask). In the case of the PSM, the PSM can include an optical pattern 120 that weakly transmits light and shifts the phase of the transmitted light, or the PSM can include an appropriate etched transparent substrate 110a which shifts the phase of the transmitted light. Thus, the transparent substrate 110a according to the present invention can include different kinds of the photomasks exposed to light.

The transparent substrate 110a is a material transparent to light, and can be made with high purity quartz such as glass or fused silica.

The optical pattern 120 is a material opaque to light, and makes an optical image using the transmitted light. The optical pattern 120 can be formed with chrome, or chrome oxide formed on the chrome according to the exemplary embodiment of the present invention. Besides chrome, the optical pattern 120 can be formed of another metal such as aluminum or molybdenum, or another metal oxide can be used instead of chrome oxide. Also, the optical pattern 120 can be a phase shift pattern. In case of the phase shift pattern, the phase shift pattern can be a molybdenum-silicon compound. Generally, this is called a MoSi series compound. That is, it can be various compounds such as MoSi, MoSiN, MoSiON, and others.

The depression defect 130 represents the type of defect where the surface of the transparent substrate 110a is lower than the surface of surrounding area. Examples of the depression defect 130 include a hole, a trench, a scratch, and a line cut into the surface.

Figure 1B:
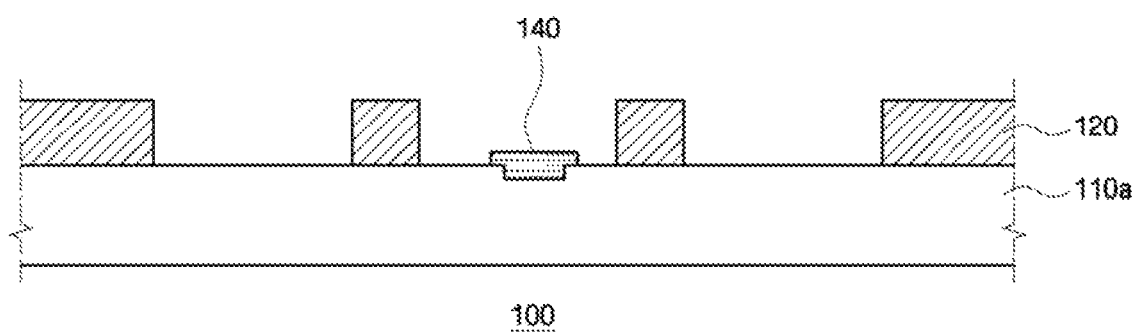

Referring to FIG. 1B, a protection layer 140 covers the depression defect 130. The protection layer 140 can be a carbon layer. The carbon layer can be deposited with FIB (focused ion beam) equipment, which is equipment for repairing photomask defects. The carbon layer is deposited because the carbon layer has an etch tolerance to the etch gas used in the step that etches the transparent substrate 110a to an adequate depth, and carbon is generally used in the FIB equipment. Thus, the protection layer 140 can be made of another material other than carbon that has an appropriate etch tolerance. The thickness of the protection layer 140 is formed such that the thickness provides etching tolerance in the step that etches the transparent substrate 110a to an adequate depth. The etching depth of the transparent substrate 140 is not fixed, but can be varied according to light used, so a specific numerical value is not described. For example, the thickness of an exemplary protection layer is about 500 Å.

Figure 1C:
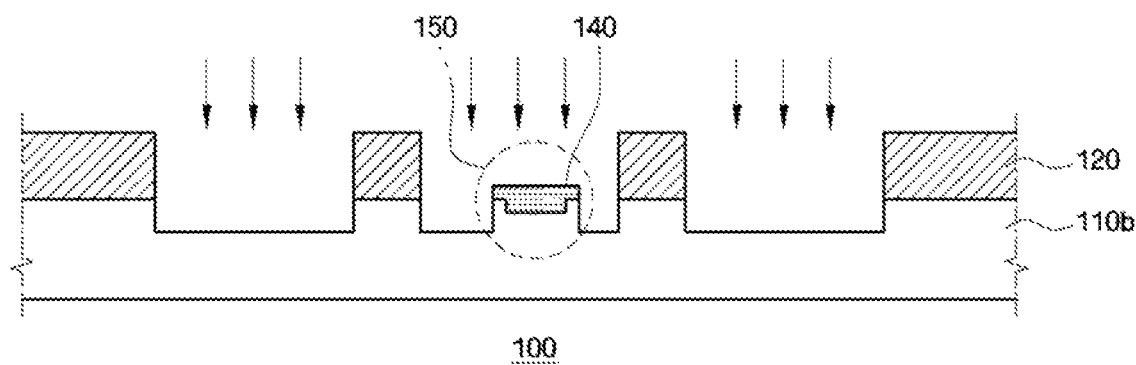

Referring to FIG. 1C, the transparent substrate 110a is etched to a moderate depth, so a recessed transparent substrate 110b is formed. As the transparent substrate 110b is quartz, the transparent substrate 110b is etched by a combination of a main etch gas such as gas including F—, for example, $CHF_3$ or CxFy series gas ($CF_4$, $C_2F_6$, $C_3F_6$, $C_4F_8$), and an assistance gas such as Ar, Xe, Cl, Br, O, N, and others. The method of etching the transparent substrate 110b is well known, so a more detailed description is omitted.

At this time, because the optical pattern 120 has a tolerance to the etching gas for forming the transparent substrate 110b, the optical pattern 120 is not etched and maintains its original shape. In order to avoid exposing the surface of the optical pattern 120 to the etching gas, an etch mask (not shown) is formed on the optical pattern 120, and then the etching process can be performed. The etch mask can be, for example, a photoresist.

The adequate depth represents the depth that allows one who uses the completed photomask 100 to perform a photolithography process without difficulties. For example, if the phase shift function is not required, the depth would allow removing the depression defect 130 with stability. If the phase shift function is required, the depth would produce the phase shift of the light. Since the depth that produces the phase shift of the light can be set according to the wavelength of the light, a specific value is not provided.

When the transparent substrate 110b is etched to the depth of the recess, a substrate area where the protection layer 140 is formed is not etched and retains its original shape. Thus, a tower shaped defect 150 that has the protection layer 140 on top is formed.

Figure 1D:
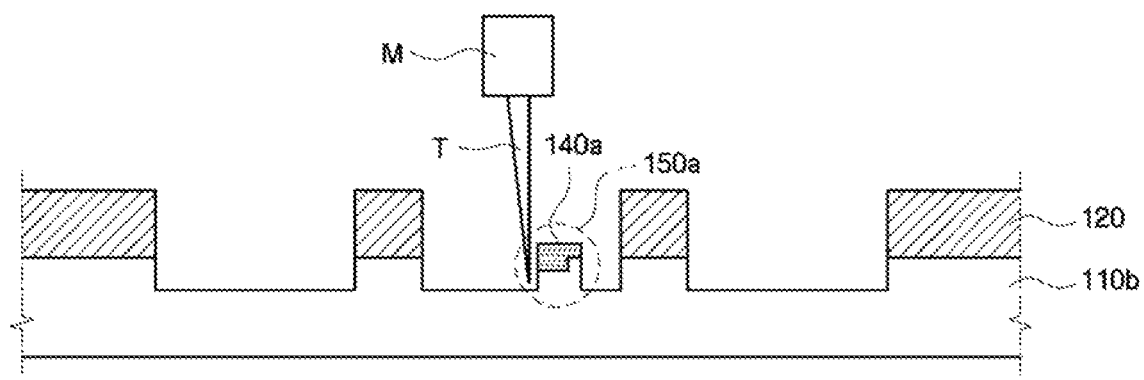

Referring to FIG. 1D, the tower shaped defect 150 is removed using a defect repairer M with high-intensity tip T. The tip T, for example, can be a high intensity material such as diamond. The defect repairer M provides impetus to tip T so that it can physically remove the tower shaped defect 150. Impetus can make the tip T move in the direction of top, bottom, left, and right, and it can make the tip T vibrate. In a present exemplary embodiment, it is designed to make the tip T vibrate. Thus, in this exemplary embodiment the tip T performs carving, rubbing, polishing, or grinding the tower shaped defect 150. In the drawing, the defect repairer M can make tip T remove the tower shaped defect 150 by moving from left to right.

Figure 1E:
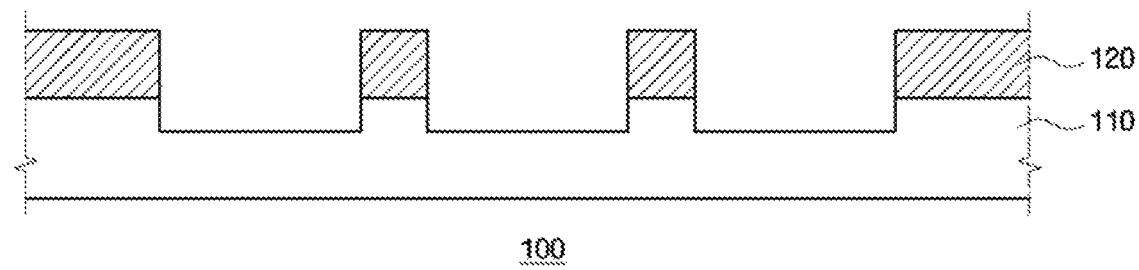

Referring to FIG. 1E, the photomask 100, whose the depression defect 130 is repaired on the transparent substrate 110, is completed.

FIG. 2A through 2D are sectional views sequentially illustrating a photomask defect correct method according to another embodiment of the present invention.

Figure 2A:
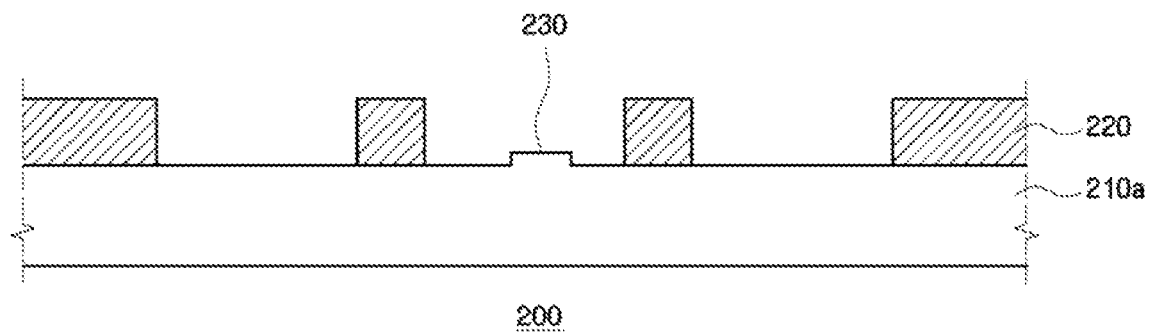
FIG. 2A through 2D are sectional views sequentially illustrating a photomask defect correction method according to another exemplary embodiment of the present invention.

Referring to FIG. 2A, a protrusion defect 230 occurs on a transparent substrate 210a of a photomask 200 which has an optical pattern 220 on one side. The protrusion defect 230 represents all types of defects where the surface of the transparent substrate 210a is higher than the surrounding area of the surface. It can he understood as the opposite case of the depression defect 130 shown in FIG. 1A.

Figure 2B:
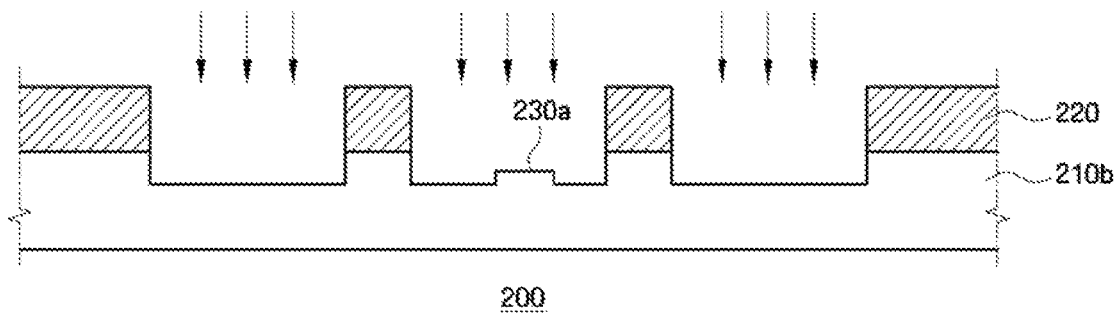

Referring to FIG. 2B, a recessed transparent substrate 210b is formed by etching the transparent substrate 210a to an adequate depth. In this step, the protrusion defect 230a is also recessed, however it is recessed such that it retains the original shape of the defect. A description of the recessing is similar to that of FIG. 1C.

Figure 2C:
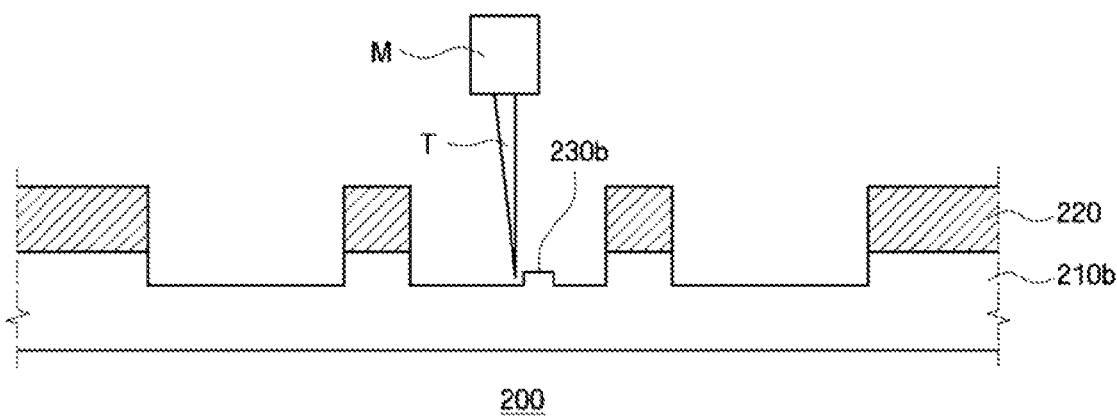

Referring to FIG. 2C, the protrusion defect 230b on the surface of the transparent substrate 210B is removed using a defect repairer M with the high-intensity tip T such as that described in connection with FIG. 1D.

Figure 2D:
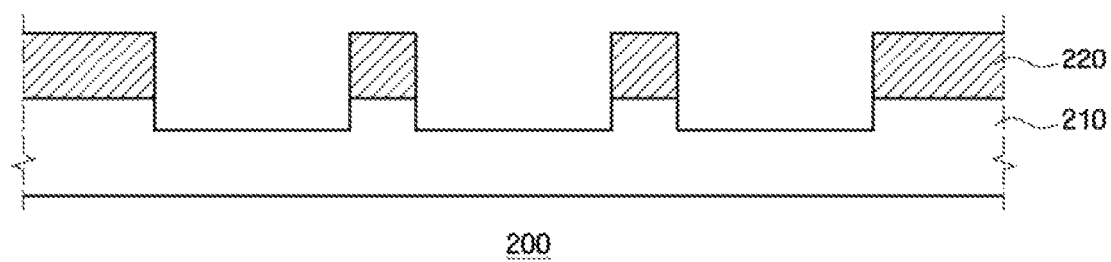

Referring to FIG. 2D, the photomask 200, whose protrusion defect 230 is repaired on the transparent substrate 210, is completed.

FIG. 3A through 3G are sectional views sequentially illustrating a photomask defect correction method according to another embodiment of the present invention.

Figure 3A:
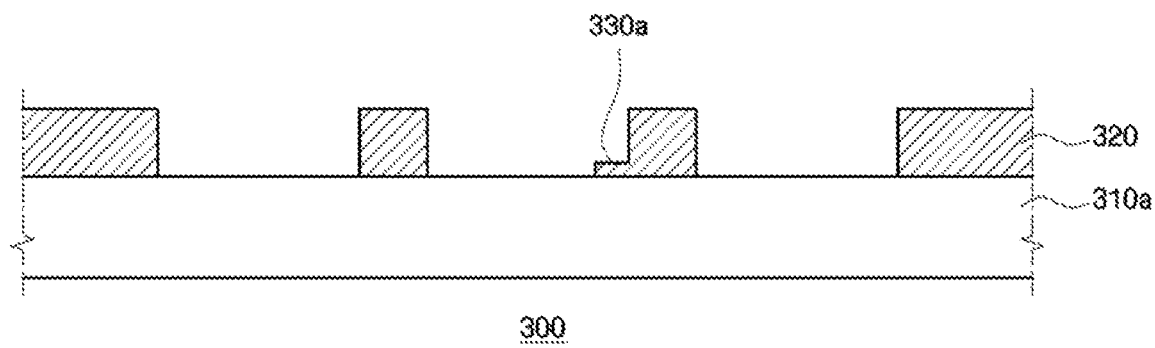
FIG. 3A through 3G are sectional views sequentially illustrating a photomask defect correction method according to another exemplary embodiment of the present invention.

Referring to FIG. 3A, a dark defect 330a occurs on the surface of a transparent substrate 310a of a photomask 300. The dark defect 330a represents all types of defects that are opaque to light on the surface of the transparent substrate 310a. For example, it can be the defect due to incomplete removal of an optical pattern 320, or it can be the defect due to the adhesion of an alien substance. In this exemplary embodiment the former case, which is a typical case, is used for illustration. In case of a defect due to the adhesion of an alien substance, it is common that cleaning process or shallow etching process is performed before applying method according to an embodiment of the present invention. If a defect occurs due to a malicious alien substance, it can be removed by applying method according to an embodiment of the present invention.

Figure 3B:
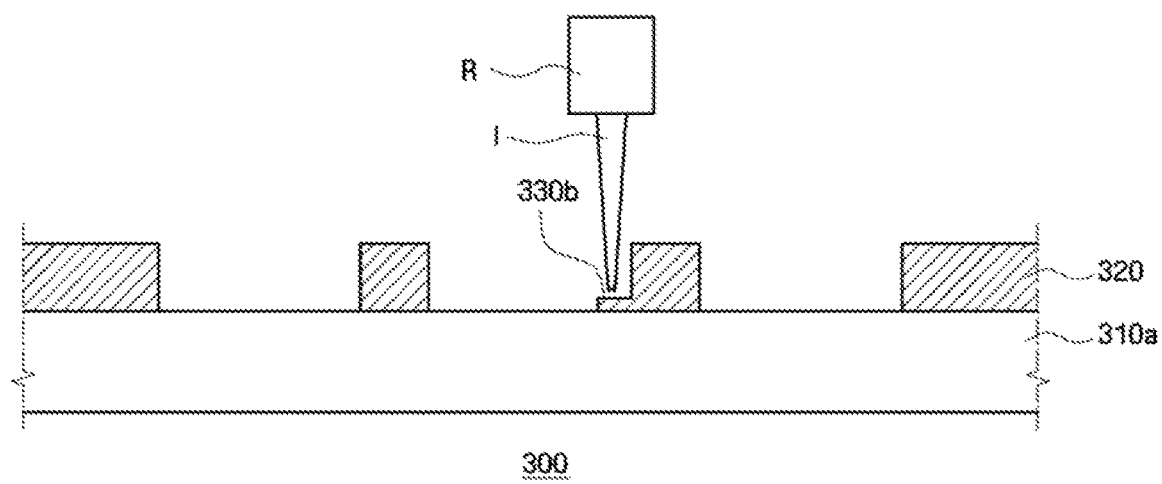

Referring to FIG. 3B, the dark defect 330b present on the surface of the transparent substrate 310a is removed using an ion beam L. For example, the dark defect 330b can be physically removed by using a gallium ion beam. Another method is to use laser to remove the defect. In this case, the dark defect 330b is exposed to laser to be vaporized. The drawing reference index R can be understood as an ion beam gun or a laser gun, and the drawing reference index I can be understood as ion beam or laser.

Figure 3C:
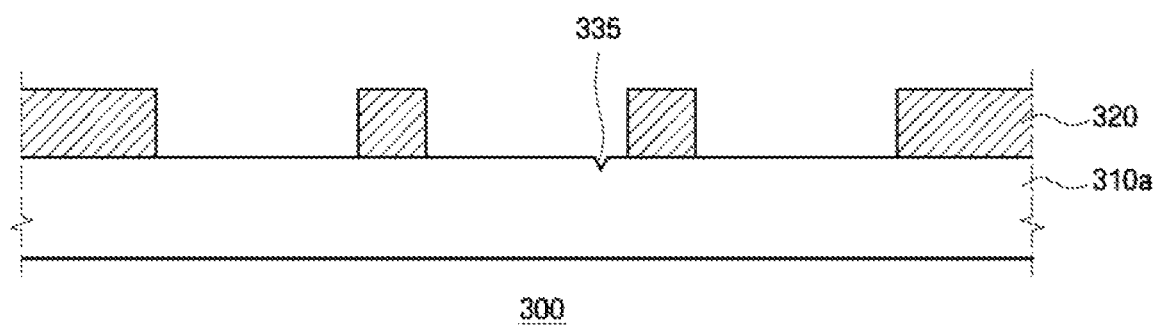

Referring to FIG. 3C, a river-bed defect 335 occurs after the dark defect 330b is removed. The river-bed defect 335 is a type of depression defect. The river-bed defect 335 typically occurs on the surface of the transparent substrate 310a after the dark defect 330a is removed by using ion beam or laser. Since the contour of the dark defect 330a, that is the interface between the dark defect 330a and the transparent substrate 310a, is weakly affected by the ion beam or laser, a defect remains on the surface of the transparent substrate 310a that is equivalent to the contour.

Figure 3D:
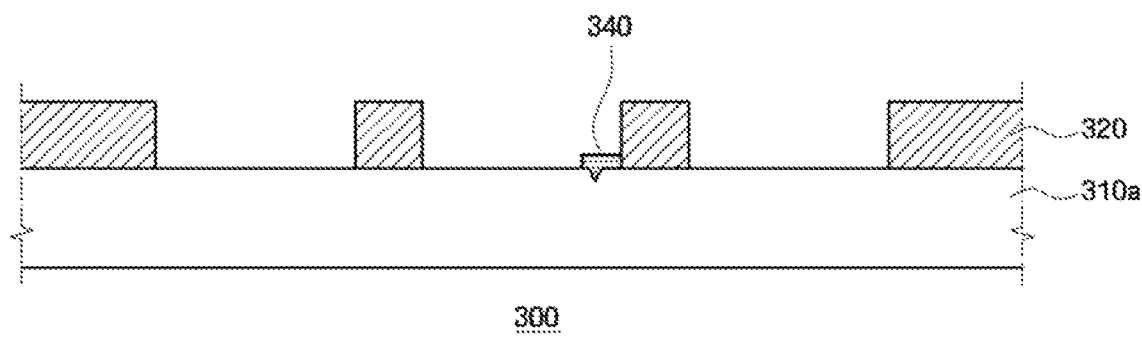

Referring to FIG. 3D, a protection layer 340 to cover the river-bed defect 335 is formed, similar to the protection layer described in connection with FIG. 1B.

Figure 3E:
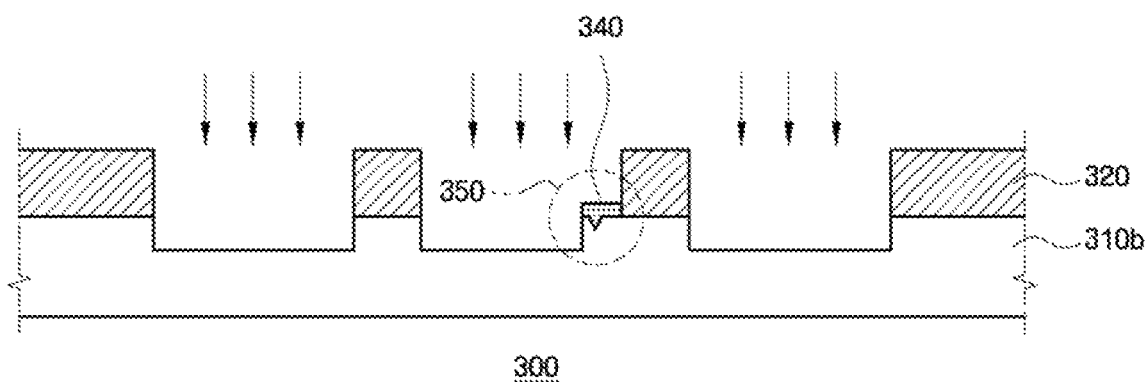

Referring to FIG. 3E, a recessed transparent substrate 310b is formed by etching the transparent substrate 310a to an adequate depth. In this step, the portion of river-bed defect 335 protected by the protection layer 340 becomes a stair-shaped defect 350, similar to the tower defect 150 described in connection with FIG. 1C.

Figure 3F:
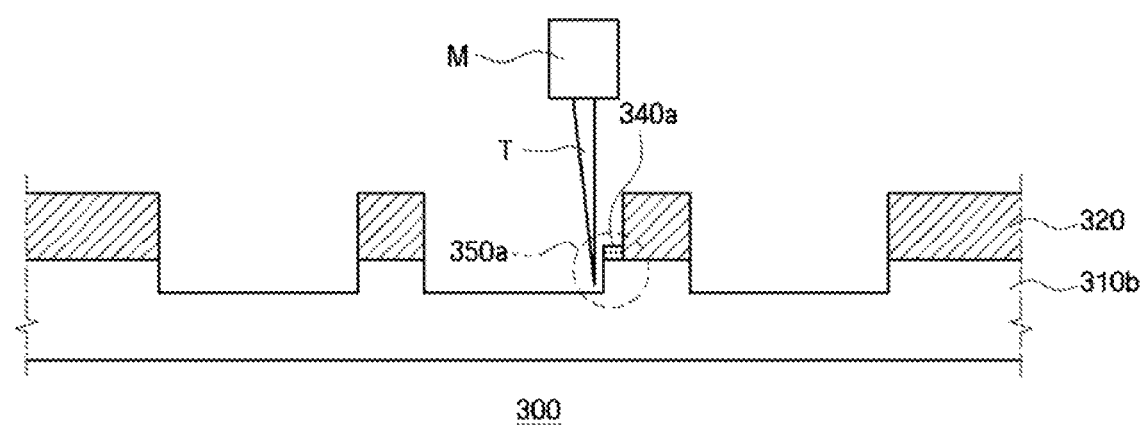

Referring to FIG. 3F, the stair-shaped defect 350a is removed by using a defect repairer M with a high-intensity tip T, similar to the defect repairer with high intensity tip described in connection with FIG. 1D.

Figure 3G:
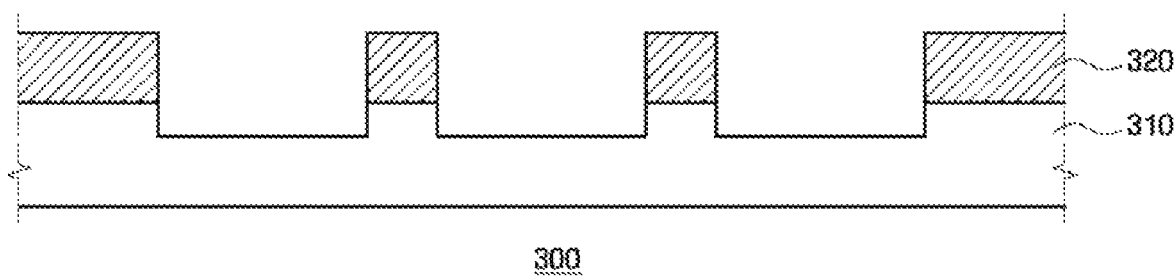

Referring to FIG. 3G, the photomask 300, in which the dark defect 330 is repaired on the transparent substrate 310, is completed.

Figure 4A:
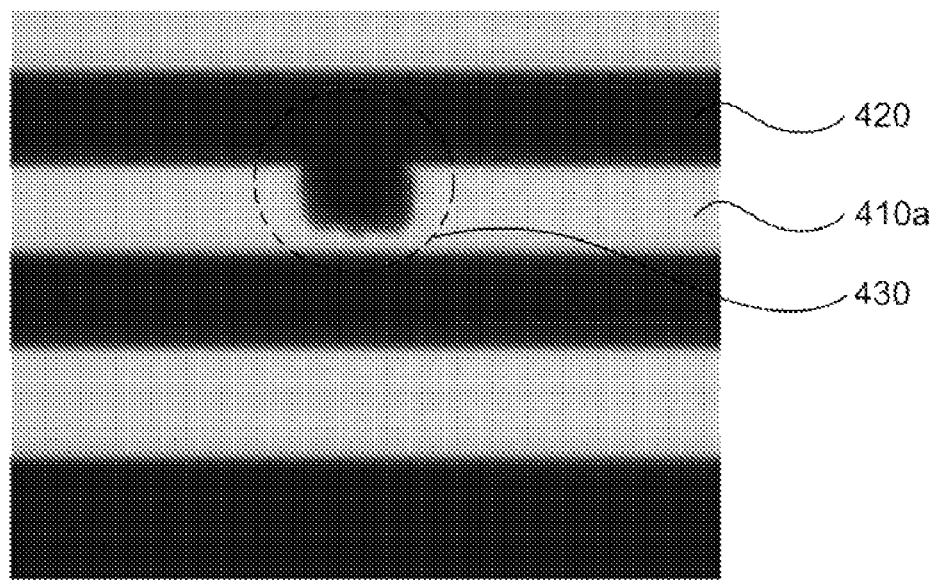
FIG. 4A through 4C are top view images captured during a process of correcting photomask defects according to the exemplary embodiments of the present invention.
Figure 4B:
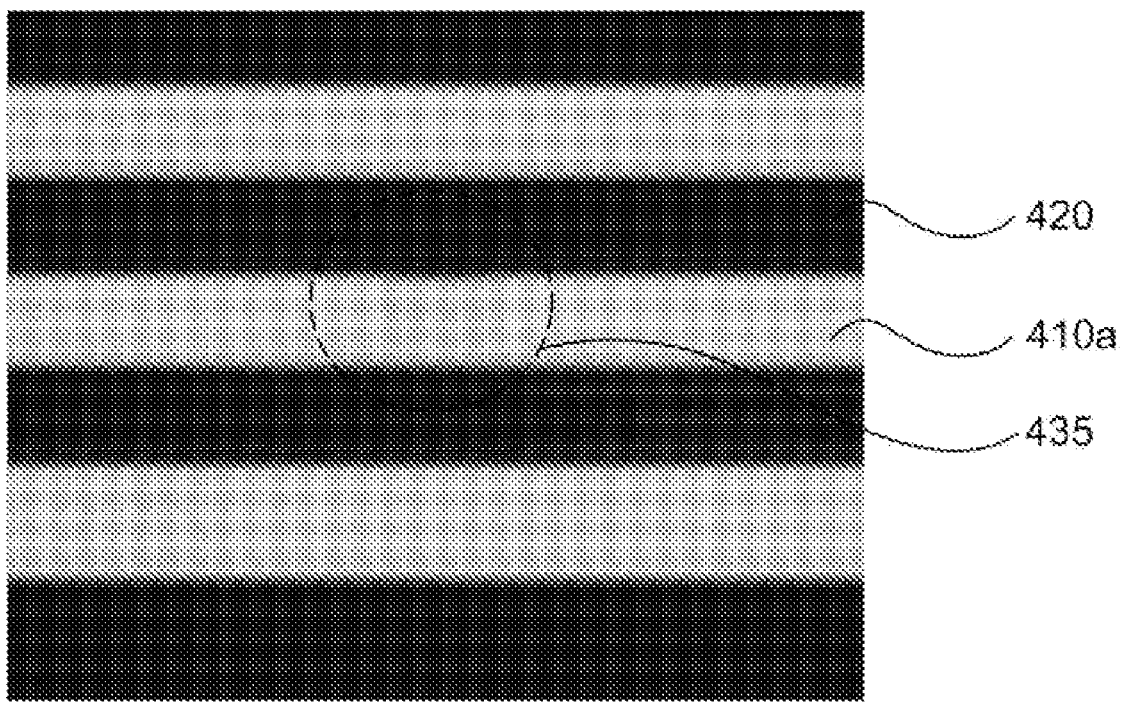
Figure 4C:
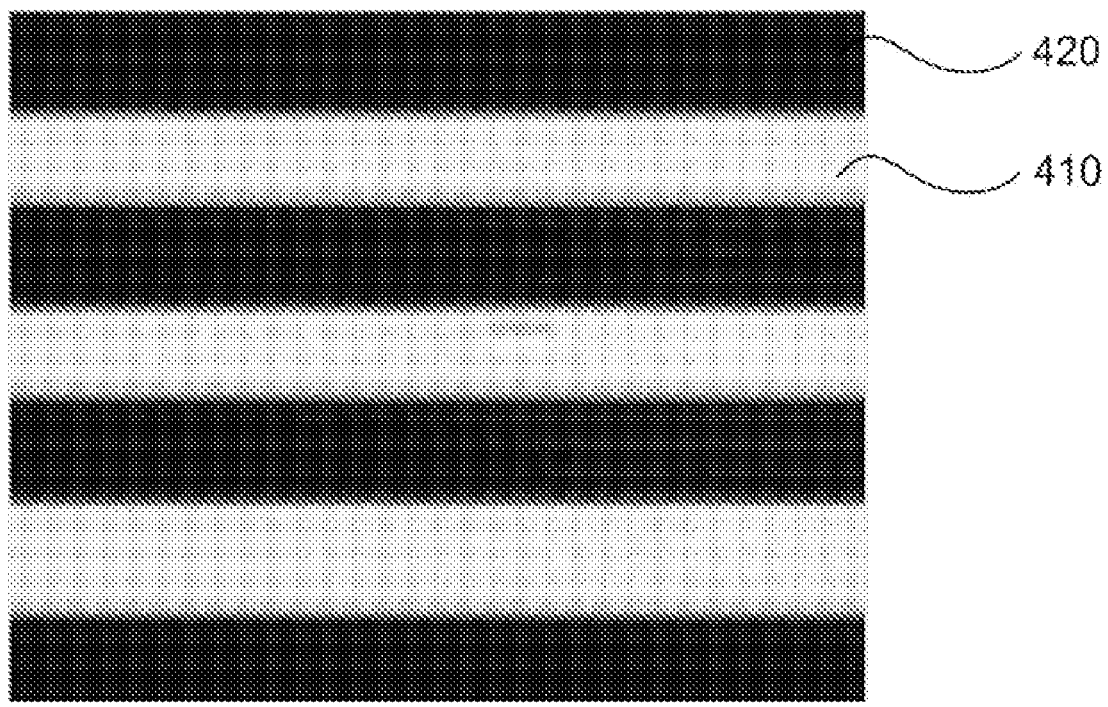

FIGS. 4A through 4C are top view images captured during a correction process of photomask defects according to exemplary embodiments of the present invention.

In FIG. 4A, a dark defect 430 occurs on the surface of the transparent substrate 410a of photomask exposed between optical patterns 420, as described in connection with FIG. 3A.

In FIG. 4B, a river-bed defect 435 remains on the surface of the transparent substrate 410a after removing the dark defect 430 using an ion beam and others, such as those described in connection with FIG. 3C.

In FIG. 4C, after forming a protection layer on top of the river-bed defect 435, and creating a recess by etching the transparent substrate 410a, the protection layer and the river-bed defect 435 formed under the protection layer are removed using a high-intensity tip.

While embodiments of the present invention has been particularly shown and described with reference to exemplary embodiments thereof, it will be apparent to those skilled in the art that the scope of the invention is given by the appended claims, rather than the preceding description, and all variations and equivalents which fall within the range of the claims are intended to be embraced therein. Therefore, it should be understood that the above embodiments are not limitative, but illustrative in all aspects.

As described above, the photomask defect correction methods and the photomask created thereby according to exemplary embodiments of the present invention, since defect marks are not left, can increase product yield.

What is claimed is:

1. A method for repairing a photomask with a depression defect, the method comprising:
    forming a protection layer which covers a depression defect in a substrate of a photomask;
    etching the substrate of the photomask to a predetermined depth with the protection layer as an etch mask wherein the substrate area under the protection layer is not etched; and
    removing the protection layer and the substrate having said depression defect under the unetched protection layer.

2. The method of claim 1, wherein the protection layer is a carbon layer formed by exposing an ion beam.

3. The method of claim 1, wherein removing the protection layer and the transparent substrate under the unetched protection layer comprises using a high-intensity tip of a defect repairer for the removal.

4. The method of claim 3, wherein removing the protection layer and the transparent substrate under the unetched protection layer with a high-intensity tip comprises having the high-intensity tip physically carving, rubbing, polishing, or grinding the protection layer and the transparent substrate under the unetched protection layer.

5. A method of repairing a dark defect on a photomask, the method comprising:
    removing a dark defect from a transparent substrate;
    forming a protection layer in an area of said transparent substrate from which the dark defect was removed;
    etching the transparent substrate of the photomask to a predetermined depth with the protection layer as an etch mask wherein the substrate area under the protection layer is not etched; and
    removing the protection layer and the transparent substrate under the unetched protection layer.

6. The method of claim 5, wherein the protection layer is a carbon layer formed by exposing an ion beam.

7. The method of claim 5, wherein removing the protection layer and the transparent substrate under the unetched protection layer is performed with a high-intensity tip of a defect repairer.

8. The method of claim 7, wherein removing the protection layer and the transparent substrate under the unetched protection layer with high-intensity tip comprises having the high-intensity tip physically carving, rubbing, polishing, or grinding the protection layer and the transparent substrate under the unetched protection layer.

9. The method of claim 5, wherein removing the dark defect is performed by an ion beam or a laser.

10. The method of claim 5, wherein the photomask includes a river bed defect on the transparent substrate in an area where the dark defect is removed.

11. The method of claim 10, further comprising a protection layer which covers the river-bed defect, etching a predetermined depth of a transparent substrate of the photomask with the protection layer as the etch mask wherein a star-shaped defect is formed; and removing the star-shed defect by removing the protection layer and the transparent substrate under the unetched protection layer using a high intensity tip of a defect repairer.

* * * * *